US009057951B2

(12) United States Patent
Allen et al.

(10) Patent No.: US 9,057,951 B2
(45) Date of Patent: Jun. 16, 2015

(54) CHEMICALLY AMPLIFIED PHOTORESIST COMPOSITION AND PROCESS FOR ITS USE

(75) Inventors: Robert D. Allen, San Jose, CA (US); Phillip J. Brock, San Jose, CA (US); Richard A. DiPietro, San Jose, CA (US); Hoa D. Truong, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 461 days.

(21) Appl. No.: 12/547,808

(22) Filed: Aug. 26, 2009

(65) Prior Publication Data
US 2011/0053083 A1  Mar. 3, 2011

(51) Int. Cl.
*G03F 7/039* (2006.01)
*G03F 7/30* (2006.01)

(52) U.S. Cl.
CPC .............. *G03F 7/0392* (2013.01); *G03F 7/30* (2013.01); *G03F 7/0397* (2013.01)

(58) Field of Classification Search
None
See application file for complete search history.

(56) References Cited

U.S. PATENT DOCUMENTS

| | | | |
|---|---|---|---|
| 4,491,628 A | 1/1985 | Ito et al. | |
| 5,372,912 A | 12/1994 | Allen et al. | |
| 5,492,793 A | 2/1996 | Breyta et al. | |
| 5,650,261 A * | 7/1997 | Winkle | 430/270.1 |
| 5,851,727 A | 12/1998 | Choi et al. | |
| 6,177,228 B1 | 1/2001 | Allen et al. | |
| 6,227,546 B1 | 5/2001 | Halling | |
| 6,280,897 B1 | 8/2001 | Asakawa et al. | |
| 6,280,898 B1 | 8/2001 | Hasegawa et al. | |
| 6,365,321 B1 * | 4/2002 | Chen et al. | 430/270.1 |
| 7,081,327 B2 | 7/2006 | Okui et al. | |
| 7,193,023 B2 | 3/2007 | Allen et al. | |
| 7,445,881 B2 | 11/2008 | Asakawa et al. | |
| 7,476,492 B2 | 1/2009 | Allen et al. | |
| 2002/0136982 A1 * | 9/2002 | Goodall et al. | 430/270.1 |
| 2003/0114589 A1 * | 6/2003 | Suetsugu et al. | 525/132 |
| 2003/0203307 A1 * | 10/2003 | Soyano et al. | 430/270.1 |
| 2005/0053861 A1 * | 3/2005 | Yoneda et al. | 430/270.1 |
| 2006/0141387 A1 | 6/2006 | Okui et al. | |
| 2006/0141388 A1 * | 6/2006 | Okui et al. | 430/270.1 |
| 2006/0141389 A1 | 6/2006 | Okui et al. | |
| 2007/0275324 A1 | 11/2007 | Allen et al. | |
| 2008/0193872 A1 * | 8/2008 | Caporale et al. | 430/270.1 |
| 2008/0248425 A1 * | 10/2008 | Nishiyama et al. | 430/285.1 |

FOREIGN PATENT DOCUMENTS

| | | |
|---|---|---|
| CN | 1054838 A | 9/1991 |
| CN | 1216618 A | 5/1993 |
| CN | 101256355 A | 9/2008 |
| EP | 1739483 A2 | 1/2007 |
| JP | 2003-156849 A | 5/2003 |
| JP | 2003287890 A | 10/2003 |
| JP | 2004309775 A | 11/2004 |
| JP | 2004309778 A | 11/2004 |
| JP | 2006267475 A | 10/2006 |
| JP | 2007010748 A | 1/2007 |
| JP | 2008151953 A | 7/2008 |
| JP | 2009-063824 A | 3/2009 |
| JP | 2009-098671 A | 5/2009 |
| KR | 20080088499 A | 10/2008 |

OTHER PUBLICATIONS

Machine-assisted English translation of JP 2004-309775 (as provided by JPO).*
International Search Report and Written Opinion of the International Searching Authority for International Application No. PCT/EP2010/061292; date of Mailing: Nov. 2, 2010; 14 pages.
English Abstract for JP10301284; published Nov. 13, 1998; 1 page.
English Abstract for JP11352694; published Dec. 24, 1999; 1 page.
English Abstract for JP2009063823; published Mar. 26, 2009; 1 page.
Hinsberg, W., et al., "Effect of Resist Components on Image Spreading During Postexposure Bake of Chemically Amplified Resists", In Advances in Resist Technology and Processing XVII, Proceedings of SPIE vol. 3999 (2000), pp. 148-160.
Houle, F.A., et al., "Determination of coupled acid catalysis-diffusion processes in a positive-tone chemically amplified photoresist", J. Vac. Sci. Technol. B. 18(4), Jul./Aug. 2000, pp. 1874-1885.
Ito, Hiroshi, "Chemical Amplification Resists for Microlithography", Adv. Polym. Sci. (2005), 172, pp. 37-245.
Nalamasu, Omkaram, et al., "An Overview of Resist Processing for Deep-UV Lithography", Journal of Photopolymer Science and Technology, vol. 4, No. 3 (1991), pp. 299-318.
English Abstract of Korean Publication No. KR20080088499 A, published on Oct. 10, 2008; 2 pages.
Thompson L, et al., "Introduction to Microlithography", American Chemical Society, Acs Symposium; Series 219 (1983), Introductory pp. 1-13, (20 pages total).

* cited by examiner

*Primary Examiner* — Sin Lee
(74) *Attorney, Agent, or Firm* — Cantor Colburn LLP

(57) ABSTRACT

Photoresist compositions include a blend of a phenolic polymer with a (meth)acrylate-based copolymer free of ether-containing and/or carboxylic acid-containing moieties. The (meth)acrylate copolymer includes a first monomer selected from the group consisting of an alkyl acrylate, a substituted alkyl acrylate, an alkyl (meth)acrylate, a substituted alkyl methacrylate and mixtures thereof, and a second monomer selected from the group consisting of an acrylate, a (meth) acrylate or a mixture thereof having an acid cleavable ester substituent; and a photoacid generator. Also disclosed are processes for generating a photoresist image on a substrate with the photoresist composition.

16 Claims, 6 Drawing Sheets

ECOMA - NLM		ESCAP 140 nm 150 nm 160 nm

CHEMICALLY AMPLIFIED PHOTORESIST COMPOSITION AND PROCESS FOR ITS USE

BACKGROUND

This invention generally relates to chemically amplified photoresist compositions and processes for its use. More particularly, the photoresist composition includes a blend of a phenolic polymer and a (meth)acrylate based copolymer.

There is a desire in the industry for higher circuit density in microelectronic devices which are made using lithographic techniques. One method of increasing the number of components per chip is to decrease the minimum feature size on the chip, which requires higher lithographic resolution. The use of shorter wavelength radiation (e.g., 190 to 315 nm) offers the potential for higher resolution. However, with deep UV radiation, fewer photons are transferred for the same energy dose and higher exposure doses are required to achieve the same desired photochemical response. Further, current lithographic tools have greatly attenuated output in the deep UV spectral region.

In order to improve sensitivity, several acid catalyzed chemically amplified photoresist compositions have been developed such as those disclosed in U.S. Pat. No. 4,491,628 and Nalamasu et al., "An Overview of Resist Processing for Deep-UV Lithography", J. Photopolymer Sci. Technol. 4, 299 (1991). The photoresist compositions generally comprise a photosensitive acid generator (i.e., photoacid generator or PAG) and an acid sensitive polymer. The polymer has acid sensitive side chain (pendant) groups which are bonded to the polymer backbone and are reactive towards a proton. Upon imagewise exposure to radiation the photoacid generator produces a proton. The photoresist film is heated and, the proton causes catalytic cleavage of the pendant group from the polymer backbone. The proton is not consumed in the cleavage reaction and catalyzes additional cleavage reactions, thereby chemically amplifying the photochemical response of the resist. The cleaved polymer is soluble in polar developers such as alcohol and aqueous base while the unexposed polymer is soluble in nonpolar organic solvents such as anisole. Thus, the photoresist can produce positive or negative images of the mask depending on the selection of the developer solvent. Advances in resist technology have provided chemically amplified photoresist compositions capable of resolving sub-22 nm lines using 193 nm immersion techniques. While these high performance materials are essential for stringent front end design requirements, they are generally unsuitable for back end applications due to their extremely high cost, complex processing conditions, and relatively thin film restrictions. Thus, for back end requirements, less sophisticated resists are used such as those described by Ito, "Chemical Amplification Resists for Microlithography", Adv. Polym. Sci. (2005) 172, 37-245. These resists, capable of resolving features down to the range of about 100-130 nm, generally comprise a protected (acid sensitive protecting group) hydroxystyrene/acrylate copolymer and operate at an incident wavelength of 248 nm. While these photoresists are currently firmly established in the industry, they do suffer from relatively high production costs. In order to address this issue Allen et al. disclosed in U.S. Pat. No. 5,372,912 a blend of commercially available poly(meth)acrylate and phenolic polymers (e.g., novolac resins), which retained the advantages of the hydroxystyrene/acrylate copolymer commonly used in the front end applications (at that time) at a significantly lower cost. There still remains, however, a need in the industry for a low cost resist with improved resolution and the flexibility to encompass thick film applications (such as liquid crystal and other flat panel displays) and various dissolution and etch resistance requirements.

Although chemically-amplified resists have been developed for 248, 193 and 157 nm lithography, certain barriers to achieving higher resolution and smaller feature sizes remain due to physical, processing and material limitations. One such phenomenon that arises, resulting in diminished image integrity in the pattern, is referred to as "image blur" (see, e.g., Hinsberg et al., Proc. SPIE, (2000), 3999, 148 and Houle et al., J. Vac. Sci. Technol B, (2000), 18, 1874). Image blur is generally thought to result from two contributing factors: gradient-driven acid diffusion (acid mobility) and reaction propagation, the result being a distortion in the developable image compared to the projected aerial image transferred onto the film. The acid mobility in the polymer is dependent on a variety of factors, including, among others, the chemical functionality of the polymer; the temperature and time of baking during resist processing and the presence of acid-quenchers. The extent of thermally induced image blur is estimated to be on the order of 50 nm with conventional resists and processing (see also Breyta et al., U.S. Pat. No. 6,227,546). R. Sooriyakumaran recently disclosed two low blur technologies for 193 nm FARM resists, the first of which is based on various acid-labile acetal/ketal protecting groups (U.S. Pat. No. 7,193,023, Filed Dec. 4, 2003) with surprisingly low processing (PEB) temperatures in the presence of stoichiometric water molecules and the second of which (U.S. Pat. No. 7,476,492, Filed May 26, 2006) involves acid-labile tertiary alkyl esters also with unexpectedly low PEB temperatures. The latter technique benefits from longer shelf life and less run-to-run variability and does not require adventitious moisture to operate. The exceptionally low PEB temperatures realized by these resists is largely the result of acidic comonomers (i.e., hexafluoroalcohols and fluorosulfonamides) which provide a mildly acidic bulk environment thereby abetting the action of photogenerated acid. The major disadvantage of these resists is their high cost of manufacture and their relatively high absorbance at 193 nm thus restricting their use to very thin films in front end applications.

Accordingly, there is a need in the art for improved radiation sensitive photoresist compositions for back end applications that are low cost, capable of resolving feature sizes of less than 100 nanometers (nm), and are of lower absorbance so as to permit the use of these photoresists in thicker film applications.

SUMMARY

The shortcomings of the prior art are overcome and additional advantages are provided through the provision of photoresist compositions and processes for generating a photoresist image. The photoresist composition comprises a blend of a phenolic polymer with a (meth)acrylate-based copolymer free of an ether-containing moiety and/or a carboxylic acid-containing moiety, the (meth)acrylate-based copolymer comprising i) a first monomer selected from the group consisting of an alkyl acrylate, a substituted alkyl acrylate, an alkyl (meth)acrylate, a substituted alkyl methacrylate and mixtures thereof, and ii) a second monomer selected from the group consisting of an acrylate, a methacrylate and mixtures thereof, the second monomer having an acid cleavable ester substituent; and a photoacid generator.

The process for generating a photoresist image on a substrate comprises coating the substrate with a photoresist film comprising a blend of a phenolic polymer with a (meth)acrylate-based copolymer free of an ether-containing moiety and/or a carboxylic acid-containing moiety, the (meth)acrylate copolymer comprising i) a first monomer selected from the group consisting of an alkyl acrylate, a substituted alkyl acrylate, an alkyl (meth)acrylate, a substituted alkyl methacrylate and mixtures thereof, and ii) a second monomer selected from the group consisting of an acrylate, a (meth) acrylate and mixtures thereof, the second monomer having an acid cleavable ester substituent, and a photoacid generator; imagewise exposing the film to radiation; heating the film to a temperature less than 110° C.; and developing the image to the substrate.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

Figure 1:
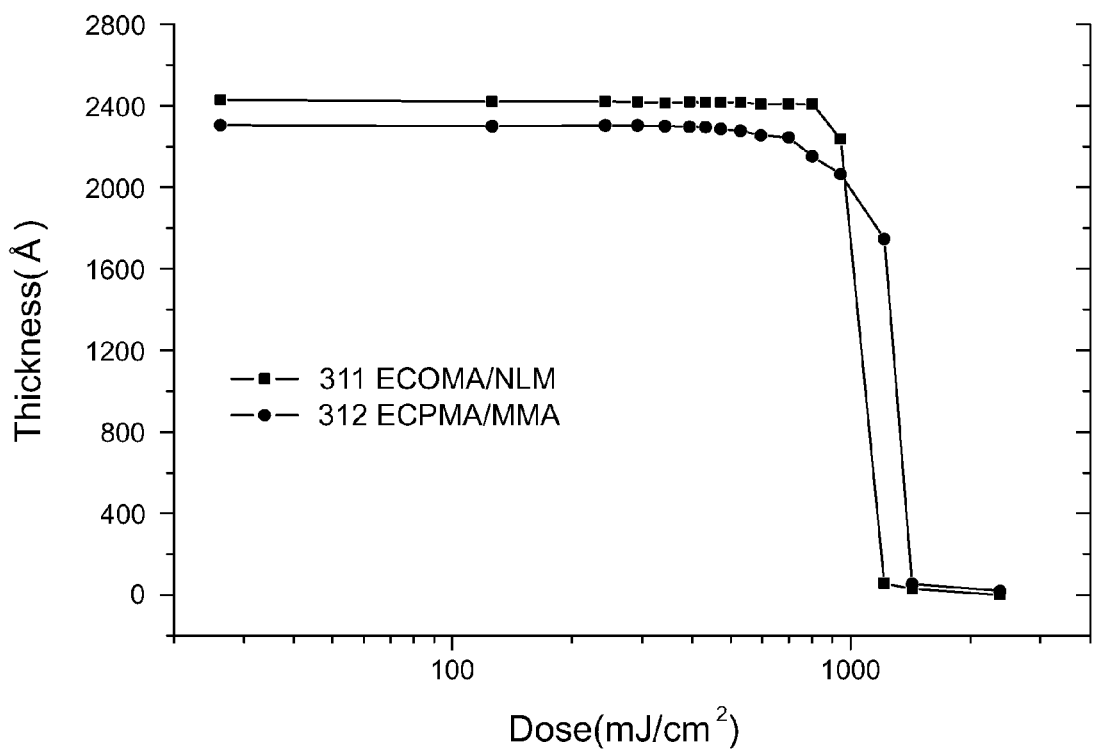
FIG. 1 is a graph of comparative contrast curves for various photoresist compositions of the present invention sensitized with anthracenemethanol and exposed at i-line (365 nm).

The detailed description explains the preferred embodiments of the invention, together with advantages and features, by way of example with reference to the drawings.

DETAILED DESCRIPTION

Disclosed herein are radiation sensitive photoresist compositions. As will be discussed in greater detail below, the radiation sensitive photoresist compositions are well suited for back end applications at a DUV exposure wavelength of 248 nm. Optionally, the photoresist composition can be sensitized to function as an i-line photoresist for imaging at 365 nm for thick film applications. The radiation sensitive photoresist compositions are of relatively low cost, capable of resolving feature sizes of less than 100 nanometers (nm), and exhibit relatively low absorbance at the imaging wavelengths. The radiation sensitive photoresist compositions generally include a (meth)acrylate based copolymer free of an ether-containing moiety and/or a carboxylic acid-containing moiety, a phenolic polymer that is soluble in an aqueous base, and a photoacid generator. Surprisingly, given the absence of carboxylic acid moieties, no phase incompatibility was observed between the (meth)acrylate based copolymer and the phenolic polymer.

The (meth)acrylate based copolymer free of an ether-containing moiety and/or a carboxylic acid-containing moiety is the reaction product of two monomers. The term (meth)acrylate is intended to indicate that a compound has either an acrylate ($CH_2=CHCOO-$) or a methacrylate ($CH_2=CCH_3COO-$) group. The first monomer is selected from an alkyl acrylate, a substituted alkyl acrylate, an alkyl methacrylate, a substituted alkyl methacrylate and mixtures thereof. Preferred alkyl esters are methyl and ethyl.

The first monomer may also include at least one hydroxyl group. Suitable hydroxy containing acrylate monomers are as follows:

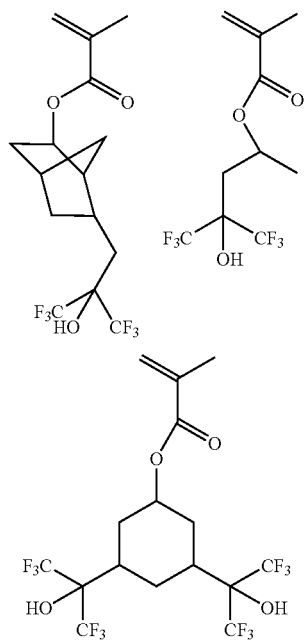

The first monomer may also include at least one sulfonylamido group. Suitable sulfonylamido acrylate monomers are as follows:

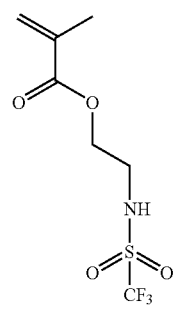 [SMILES: C=C(C)C(=O)OCCNS(=O)(=O)C(F)(F)F]

The first monomer may also include at least one lactone group. The lactone substituent may be a $C_4$-$C_{20}$ lactone substituent. Suitable lactone acrylate monomers are as follows:

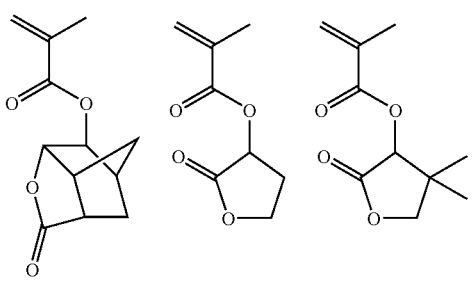

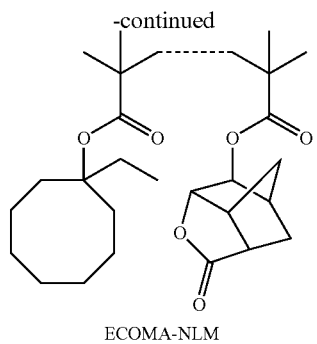

ECOMA-NLM

The second monomer is a (meth)acrylate having an acid cleavable tertiary ester substituent, which has surprisingly low activation energy. This low activation energy is believed to be due to interactions between the first and second monomers of the polymer of the present invention. Due to the low activation energy of the cleavable substituent, the copolymer does not require the typically high post exposure bake (PEB) temperature to cause the acid cleavage of the ester substituent after the photoresist composition has been exposed to radiation. This low activation energy allows the use of a low PEB temperature, thereby minimizing undesired thermally catalyzed diffusion of the photogenerated acid to areas of the photoresist film which were not exposed to radiation, thus resulting in sharper line widths and improved resist performance. As a result, the image blur problem noted in the prior art is minimized. Additionally, sharper line widths and improved resist performance are realized by lower PEB temperatures in conjunction with phenolic polymers having low glass transition temperatures such as novolac resins.

Suitable second monomers having the acid cleavable tertiary ester substituent include, without limitation, 1-methylcyclopentyl(meth)acrylate (MCPMA), 1-ethylcyclopentyl (meth)acrylate (ECPMA), 1-ethylcyclohexyl (meth)acrylate (ECHXMA), 1-ethylcycloheptyl (meth)acrylate (ECHPMA), 1-ethylcyclooctyl (meth)acrylate (ECOMA), 1-ethylcyclodecyl (meth)acrylate (ECDMA), 1-ethylcyclododecyl (meth)acrylate (ECDDMA), 1-ethyl-2-methoxycyclohexyl (meth)acrylate (EMOCHMA), 1-butylcyclohexyl (meth)acrylate (BCHXMA), 1-butyl-2-methoxycyclohexyl (meth)acrylate (BMOCHXMA), 1-cyclopentylcyclopentyl (meth)acrylate (CPCPMA), 1-isopropylcycloheptyl (meth) acrylate (IPCHPMA), 2, 5-dimethyl-1-methylcyclohexyl (meth)acrylate, and mixtures thereof.

Suitable copolymers for the radiation sensitive composition of the present invention include the following:

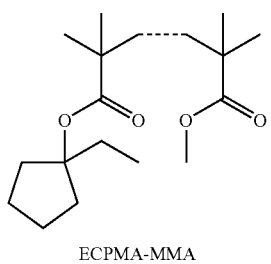

ECPMA-MMA

The choice of the specific monomers and their weight percent in the copolymer can be varied depending upon the properties desired in the copolymer. For example, by varying the percentage of the methacrylic acid ester component in the copolymer, the dissolution enhancement/inhibition property of the copolymer can be optimized in a specific binder without varying the amount of the copolymer in the composition. The radiation sensitivity of the copolymer can be varied by varying the percentage of the second monomer component with the acid labile group. Lastly, the glass transition temperature can be varied to some extent by varying the relative percentage of the acrylate component with the methacrylic acid ester component in the copolymer within the range of solubility of the copolymer in the binder. The copolymer is uniquely and unexpectedly soluble in phenolic binders to enable the formation of a homogenous composition without phase separation. The (meth)acrylate based copolymer is also substantially transparent in the deep UV spectrum, thereby enabling the use of phenolic (e.g., novolac) polymers as binders for deep UV lithography.

The (meth)acrylate based copolymer of the present invention will generally comprise the first monomer in an amount of 50 to 90 weight % of the total weight of the copolymer; and the second monomer with the low activation energy acid labile group component in an amount of about 10 to 50 weight percent of the total weight of the copolymer. In other embodiments, the (meth)acrylate based copolymer will comprise the first monomer in an amount of about 60 to 80 weight percent of the total weight of the copolymer; and the second monomer with the low activation energy acid labile group component will be in an amount of 20 to 40 weight percent of the total weight of the copolymer.

In one embodiment, the (meth)acrylate based copolymer has an average weight molecular weight of 2 to 100 K Daltons; in other embodiments, the (meth)acrylate based copolymer has an average weight molecular weight of 3 to 25 K Daltons; and in still other embodiments, the (meth)acrylate based copolymer has an average weight molecular weight of 4 to 10 K Daltons. The preferred polydispersity index (PDI) of the polymers is from 1 to 3.

The phenolic polymers are taken from a class of addition polymers based on hydroxystyrenes (pHOSTs) and/or are condensation polymers (e.g., novolacs), which are the reaction products of an aldehyde such as acetaldehyde or formaldehyde, and a phenol such as phenol itself, or phenol substituted with 1 or 2 alkyl groups of 1 to 9 carbon atoms each, e.g., o-, m-, and p-cresol, the xylenols, p-tert-butyl phenol, and p-nonylphenol, p-phenyl-phenol, resorcinol and bis(4-hydroxyphenyl)methane. In one embodiment, the weight average molecular weight of the phenolic polymer is 3 to 150 K Daltons. In other embodiments, the phenolic polymer has a weight average molecular weight of 4 to 50 K Daltons, and in still other embodiments, the phenolic polymer has a weight average molecular weight of 3 to 15 K Daltons.

The radiation sensitive photoresist composition further includes a radiation sensitive photoacid generator (PAG). These PAGs are compounds that generate an acid upon exposure to actinic radiation. In various embodiments, any suitable photoacid generating agent may be used including ionic and nonionic PAGS, so long as the selected photoacid generator dissolves sufficiently in the coating composition, and the resulting solution thereof may form a coating on a substrate by a dispensing process, or spin coating, or the like. As is well known to those skilled in the art after reading the present application, the following illustrative classes of photoacid generators may be employed in various embodiments of the present invention.

Typical photoacid generators include, without limitation: (1) sulfonium salts, such as triphenylsulfonium perfluoromethanesulfonate(triphenylsulfonium triflate), triphenylsulfonium perfluorobutanesulfonate, triphenylsulfonium perfluoropentane-sulfonate, triphenylsulfonium perfluorooctanesulfonate, triphenylsulfonium hexafluoroantimonate, triphenylsulfonium hexafluoroarsenate, triphenylsulfonium hexafluorophosphate, triphenylsulfonium bromide, triphenylsulfonium chloride, triphenylsulfonium iodide, 2,4,6-trimethylphenyldiphenylsulfonium perfluorobutanesulfonate, 2,4,6-trimethylphenyldiphenylsulfonium benzenesulfonate, tris(t-butylphenyl)sulfonium perfluorooctane sulfonate, diphenylethylsulfonium chloride, and phenacyldimethylsulfonium chloride; (2) halonium salts, particularly iodonium salts, including diphenyliodonium perfluoromethanesulfonate (diphenyliodonium triflate), diphenyliodonium perfluorobutanesulfonate, diphenyliodonium perfluoropentane-sulfonate, diphenyliodonium perfluorooctanesulfonate, diphenyliodonium hexafluoroantimonate, diphenyliodonium hexafluoroarsenate, bis-(t-butylphenyl)-iodonium triflate, and bis-(t-butylphenyl)-iodonium camphanylsulfonate; (3) α, α'-bis-sulfonyl-diazomethanes such as bis(p-toluenesulfonyl)diazomethane, methylsulfonyl p-toluenesulfonyldiazomethane, 1-cyclohexylsulfonyl-1-(1,1-dimethylethylsulfonyl)diazomethane, and bis(cyclohexylsulfonyl)diazomethane; (4) trifluoromethanesulfonate esters of imides and hydroxyimides, e.g., α-(trifluoromethylsulfonyloxy)-bicyclo[2.2.1]hept-5-ene-2,3-dicarboximide (MDT); (5) nitrobenzyl sulfonate esters such as 2-nitrobenzyl p-toluenesulfonate, 2,6dinitrobenzyl p-toluenesulfonate, and 2,4-dinitrobenzyl p-trifluoromethylbenzene sulfonate; (6) sulfonyloxynaphthalimides such as N-camphorsulfonyloxynaphthalimide and N-pentafluorophenylsulfonyloxynaphthalimide; (7) pyrogallol derivatives (e.g., trimesylate of pyrogallol); (8) naphthoquinone-4-diazides; (9) alkyl disulfones; (10) s-triazine derivatives; and (11) miscellaneous sulfonic acid generators including t-butylphenyl-α-(p-toluenesulfonyloxy)acetate, t-butyl-α-(p-toluenesulfonyloxy)acetate, and N-hydroxynaphthalimide dodecane sulfonate (DDSN), and benzoin tosylate.

Additional suitable photoacid generators useful in conjunction with the coating compositions and methods provided herein will be known to those skilled in the art.

By way of example, the PAG of the coating composition may include at least one of the following structures:

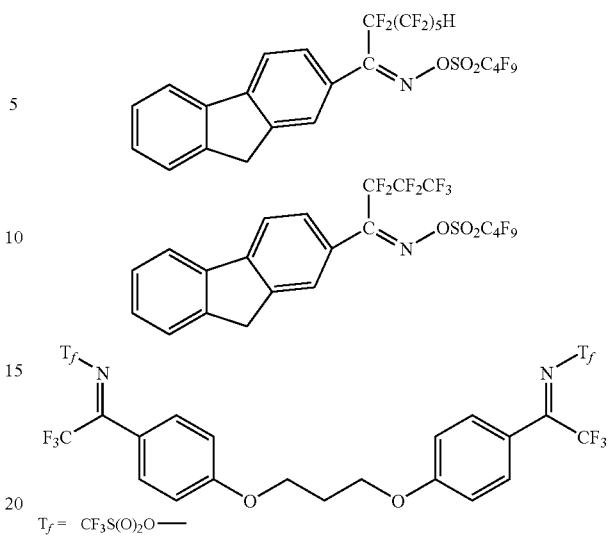

The relative amounts of each component in the photoresist composition, by total weight of the solids, are as follows. In one embodiment, the (meth)acrylate based copolymer is 5 to 95 parts by weight, the phenolic polymer is 5 to 95 parts by weight, and the photoacid generator is 0.1 to 20 parts by weight. In another embodiment, the (meth)acrylate based copolymer is less than 50 parts by weight, the phenolic polymer is greater than 50 parts by weight, and the photoacid generator is 0.1 to 20 parts by weight. In still another embodiment, the (meth)acrylate based copolymer is less than 25 parts by weight, the phenolic polymer is greater than 75 parts by weight, and the photoacid generator is 0.1 to 20 parts by weight.

The remainder of the resist composition is generally composed of a solvent and may additionally, if necessary or desirable, include customary additives such as dyes; sensitizers (e.g., for sensitizing the photoresist composition for i-line applications) such as anthracenemethanol; additives used as stabilizers, such as phenothiazine, or coumarin 6; dissolution modifying additives; pigments; acid-diffusion controlling agents; basic compounds; coating aids such as surfactants or anti-foaming agents; crosslinking agents; photospeed control agents such as tetrabutyl ammonium hydroxide; adhesion promoters; and plasticizers.

The choice of solvent is governed by many factors not limited to the solubility and miscibility of resist components, the coating process, and safety and environmental regulations. Additionally, inertness to other resist components is desirable. It is also desirable that the solvent possess the appropriate volatility to allow uniform coating of films yet also allow significant reduction or complete removal of residual solvent during the post-application bake process. See, e.g., Introduction to Microlithography, Eds. Thompson et al., cited previously. Solvents may generally be chosen from ether-, ester-, hydroxyl-, and ketone-containing compounds, or mixtures of these compounds. Examples of appropriate solvents include cyclopentanone, cyclohexanone, lactate esters such as ethyl lactate, alkylene glycol alkyl ether esters such as propylene glycol methyl ether acetate (PGMEA), alkylene glycol monoalkyl esters such as methyl cellosolve, butyl acetate, 2-ethoxyethanol, and ethyl 3-ethoxypropionate. Preferred solvents include ethyl lactate, propylene glycol methyl ether acetate, and mixtures of ethyl lactate and ethyl 3-ethoxypropionate. The above list of solvents is for illustrative purposes only and should not be viewed as being comprehensive nor should the choice of solvent be viewed as limiting the invention in any way. Those skilled in the art will recognize that any number of solvents or solvent mixtures may be used. Greater than 50 percent of the total mass of the resist formulation is typically composed of the solvent, preferably greater than 80 percent.

The present invention also relates to a process for generating a resist image on a substrate comprising coating a substrate with a film of the radiation sensitive photoresist composition; imagewise exposing the film to radiation; heating the film, typically to a temperature less than 110° C. or below; and developing the image.

The first step involves coating the substrate with a film comprising the resist composition dissolved in a suitable solvent. The film can be coated on the substrate using art known techniques such a spray or spin coating or doctor blading. Suitably, before the film is exposed to radiation, the film is heated to an elevated temperature less than 110° C. for a short period of time to remove excess solvent. The dried film can have a thickness of about 0.2 to 10.0 microns.

The film is then imagewise exposed to an energy flux of radiation of x-ray, electron beam, EUV or ultraviolet. Suitable ultraviolet radiation is 365 nm (i-line) or 248 nm (DUV). Suitable radiation sources are KrF excimer lasers. The radiation is absorbed by the resist composition and the radiation sensitive acid generator to generate free acid.

After exposure to radiation, the film is again heated to a low temperature of about 110° C. or less for a short period time of about 1 to 2 minute(s) to cause cleavage of the acid cleavable ester substituent in the exposed portion of the photoresist composition with subsequent formation of the corresponding acid. Because this reaction can be processed at these lower temperatures, there is substantially less diffusion of the photogenerated acid into unexposed areas of the film. This reaction proceeds at this low temperature due to the lower activation energy of the acid cleavable tertiary ester substituent in the (meth)acrylate copolymer.

After heating, the resist image is developed in the film by art known techniques. Suitably, the film is exposed to a solvent, typically an aqueous base such as tetramethylammonium hydroxide. The solvent removes the portions of the film which were exposed to radiation, thus exposing the underlying substrate.

It is to be understood that while the invention has been described in conjunction with the preferred specific embodiments thereof, that the foregoing description as well as the examples that follow are intended to illustrate and not limit the scope of the invention. Other aspects, advantages and modifications within the scope of the invention will be apparent to those skilled in the art to which the invention pertains.

EXAMPLE 1

In this example, the synthesis of a (meth)acrylate based copolymer is described. The copolymer was formed by reaction of a first monomer of methyl methacrylate (MMA) with a second monomer that was a mixture of norbornene lactone methacrylate (NLM) and 1-ethyl-1-cyclopentyl (meth)acrylate (ECPMA).

To a 250-mL 3-necked round bottom flask equipped with a temperature-controlled heating mantle, Fredrichs condenser with nitrogen inlet, thermocouple thermometer and a magnetic stirrer was added 10.94 g (60 mmol) of 1-ethyl-1-cyclopentyl (meth)acrylate, 3.00 g (30 mmol) of methyl (meth) acrylate, 6.67 g (30 mmol) of norbornene lactone (meth) acrylate, 0.485 g (2.4 mmol) of dodecanethiol, and 65.7 g of methyl ethyl ketone. The mixture was heated briefly to reflux under a nitrogen blanket. The mixture was allowed to cool until the reflux subsided, at which time 0.788 g of 2,2'-azobisisobutyronitrile (AIBN) was added all at once. The reaction was nitrogen flushed and the mixture heated to reflux and maintained under a nitrogen atmosphere. The initial reflux temperature was 81.2° C. and was 78.7° C. after 20 hours of reflux. The reaction mixture was allowed to cool to room temperature and was then added with stirring to 3.5 liters (L) of hexanes. The precipitated copolymer, poly(ECPMA/ MMA/NLM) at a ratio of 50:25:25, was stirred for 30 minutes, then filtered through a fritted glass funnel. The recovered solid was washed with 3×150 mL portions of hexanes and the filter cake dried at 60 deg C. and 100 milliTorr overnight to yield 15.1 grams of white polymer solid. The polymer had a GPC Mw (THF solvent, polystyrene standards) of 5.6 K Daltons.

EXAMPLE 2

In this example, the synthesis of poly(ECPMA/MMA) at a ratio of 50:50 is described. The (meth)acrylate based copolymer included reaction of a first monomer of methyl methacrylate (MMA) and a second monomer of 1-ethyl-1-cyclopentyl methacrylate (ECPMA).

To a 250-mL 3-necked round bottom flask equipped with a temperature-controlled heating mantle, Fredrichs condenser with nitrogen inlet, a thermocouple thermometer and a magnetic stirrer was added 10.94 g (60 mmol) of 1-ethyl-1-cyclopentyl methacrylate, 6.01 g (60 mmol) of methyl methacrylate, 0.485 g (2.4 mmol) of dodecanethiol, and 54.8 g of methyl ethyl ketone. The mixture was heated briefly to reflux under a nitrogen blanket. The mixture was allowed to cool until the reflux subsided, at which time 0.787 gram (4.8 mmol) of 2, 2'-azobisisobutyronitrile (AIBN) was added all at once. The reaction was nitrogen flushed and the mixture heated to reflux while maintaining a nitrogen atmosphere. The initial reflux temperature was 81.0° C. and was 78.2° C. after 20 hours of reflux. The reaction mixture was allowed to cool to room temperature and was then added with stirring to 3.5 L of 1:3 water/methanol. The precipitated polymer, poly (ECPMA/MMA) at a ratio of 50:50, was stirred for 30 minutes and filtered through a glass fritted funnel. The recovered solid was washed with 3×150 mL portions of 1:3 water/ methanol and dried. This precipitation process was repeated twice to yield, after drying the solid at 60° C. and 100 milli-Torr for 48 hours, 11.91 grams of a white polymer solid. The polymer had a GPC Mw (THF solvent, polystyrene standards) of 5.4 K Daltons.

EXAMPLE 3

In this example, contrast curves were generated at 365 nm for sensitized (meth)acrylate based copolymer photoresist compositions coated on bare silicon wafers. The photoresist compositions included 25 weight percent 50:50 ECOMA-MMA or ECPMA-MMA as the (meth)acrylate based copolymer (Mw=5.4 K Daltons) as a percentage of the novolac resin (Mw=4 K Daltons). The photoresist composition comprised 10 percent by weight solids dissolved in PGMEA. The solids comprised the novolac resin and (meth)acrylate based copolymer, 3 weight percent (relative to polymer) of triphenylsulfonium nonaflate, 1 weight percent (relative to polymer) of anthracenemethanol, and 0.075 weight percent (relative to polymer) of TBAH.

The photoresist compositions were spin coated onto the bare silicon wafers, post apply baked at 100° C. for 60 seconds, exposed at 365 nm using an OAI exposure tool, post exposure baked at 100° C. for 60 seconds and developed in 0.26 N tetramethylammonium hydroxide (TMAH) for 60 seconds. FIG. 1 is a graph of a contrast curve for the photoresist compositions. As shown, the photoresist compositions exhibit high contrast upon exposure at 365 nm, which in conjunction with the 248 nm radiation data below demonstrates the the versatility of the photoresist composition at different wavelengths.

EXAMPLE 4

In this example, contrast curves were generated at 248 nm for (meth)acrylate based copolymer photoresist compositions coated on bare silicon wafers. The photoresist compositions included 30 weight percent 50:50 ECOMA-NLM (Mw=5.4K Daltons) as the (meth)acrylate based copolymer based as a percentage of the novolac resin (Mw=4 K Daltons). The photoresist composition comprised 10 percent by weight solids dissolved in PGMEA. The solids comprised the novolac resin and (meth)acrylate based copolymer, 3 weight percent (relative to polymer) of triphenylsulfonium nonaflate, and 0.075 weight percent (relative to polymer) of TBAH.

Figure 2:
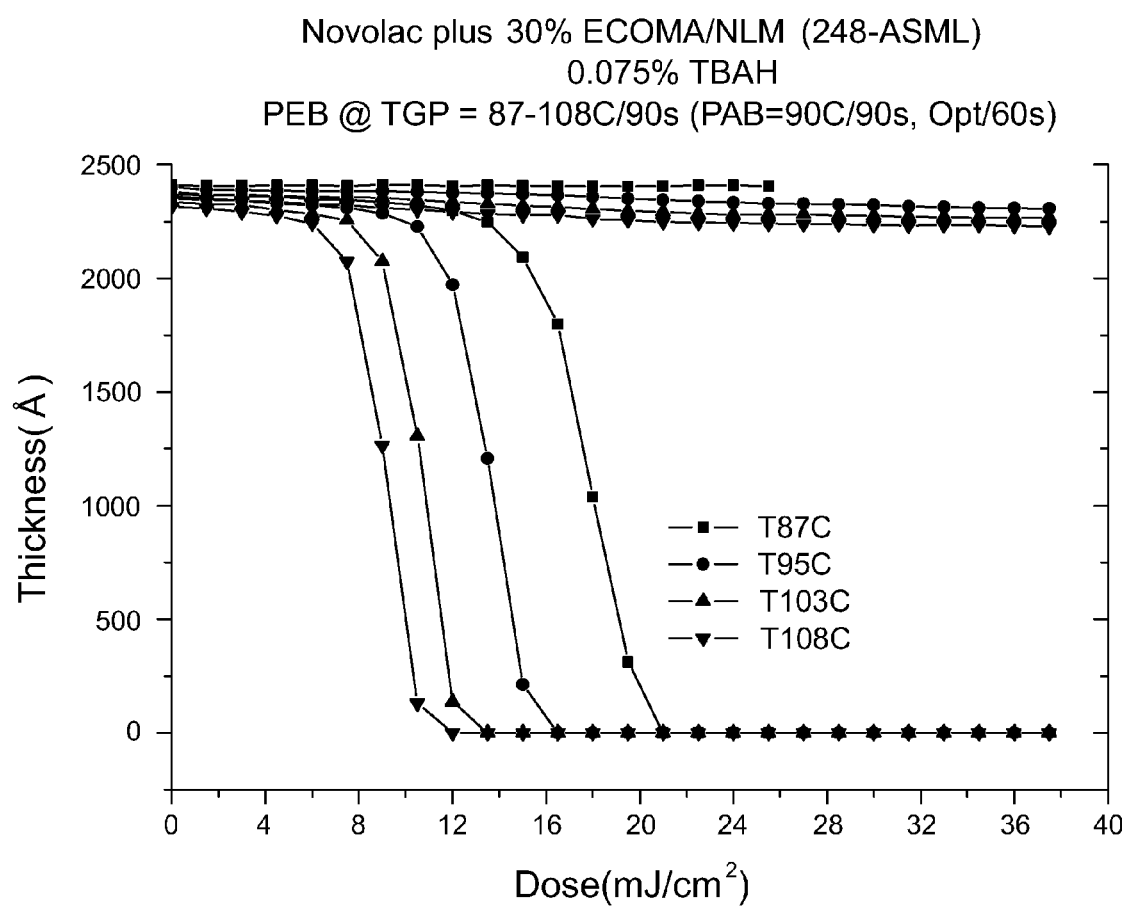
FIG. 2 is a graph of a contrast curve for an ECOMA-NLM based photoresist composition of the present invention.

The photoresist compositions were spin coated onto the bare silicon wafers, post apply baked at 90° C. for 90 seconds, exposed at 248 nm using an ASML stepper/scanner exposure tool, post exposure baked at 87, 95, 103 and 108° C. for 90 seconds and developed in 0.26 N TMAH for 60 seconds. FIG. 2 is a graph of a contrast curve for the photoresist composition. As shown, the photoresist compositions exhibit high contrast with exposure at 248 nm.

EXAMPLE 5

In this example, contrast curves were generated at 248 nm for (meth)acrylate based copolymer photoresist compositions coated on bare silicon wafers. The photoresist compositions included 25 weight percent 50:50 ECPMA-MMA (Mw=5.4 Daltons) based on the weight of the novolac resin (Mw=4K Daltons). The photoresist composition comprised 10 percent by weight solids dissolved in PGMEA. The solids comprised the novolac resin and (meth)acrylate based copolymer, 2.5 weight percent (relative to polymer) of triphenylsulfonium nonaflate, 2.5 weight percent (relative to polymer) of 1-(4-n-butoxynaphthyl)tetrahydrothiophenium-n-nonafluorobutanesulfonate and 0.3 weight percent (relative to polymer) of 2-phenylimidazole.

Figure 3:
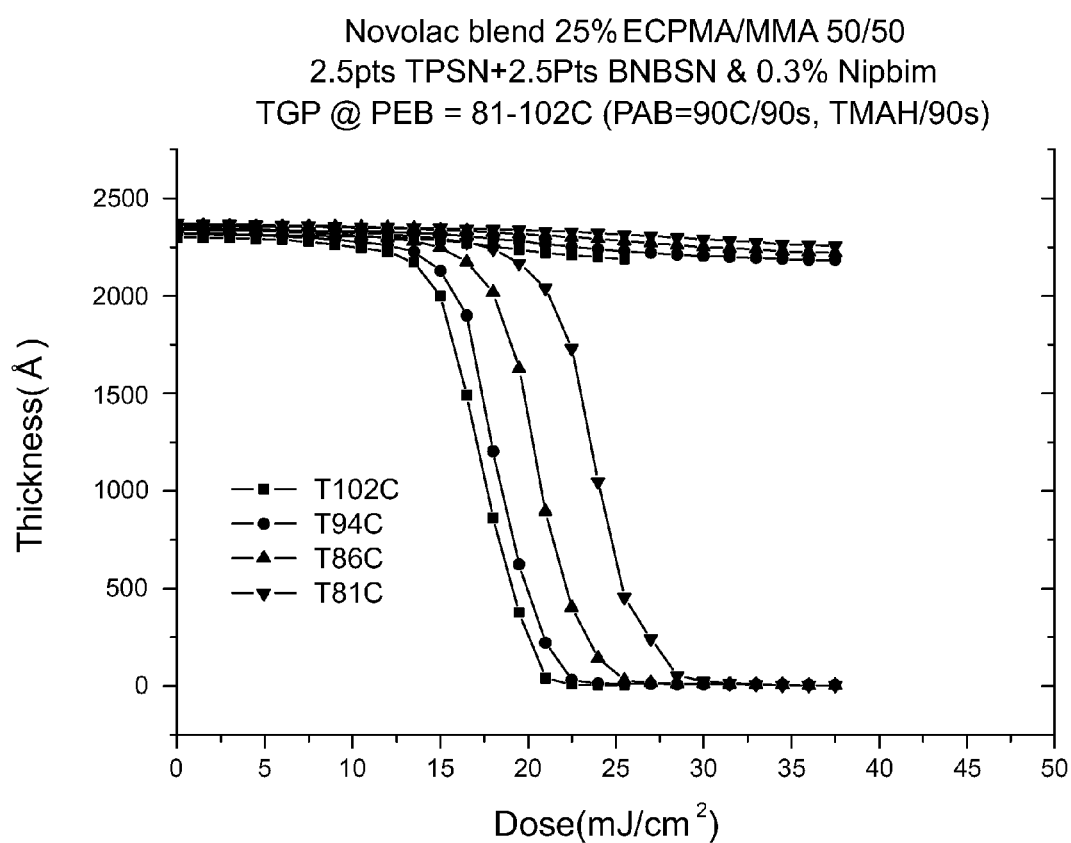
FIG. 3 is a graph of a contrast curve for an ECPMA-MMA based photoresist composition of the present invention.

The photoresist compositions were spin coated onto the bare silicon wafers, post apply baked at 90° C. for 90 seconds, exposed at 248 nm at 64 mJ/cm$^2$, post exposure baked at 81, 86, 94 and 102° C. for 90 seconds and developed in 0.26 N TMAH for 90 seconds. FIG. 3 is a graph of a contrast curve for the photoresist composition. As shown, the photoresist compositions exhibit high contrast with exposure at 248 nm.

EXAMPLE 6

In this example, contrast curves were generated at 248 nm for a comparative prior art ESCAP (environmentally stable chemically amplified photoresist) based photoresist composition available from JSR Corporation (trade name MF028/MIA042 1/1) coated on bare silicon wafers. The ESCAP based photoresist composition included a copolymer of hydroxystyrene and t-butyl acrylate in a 1:1 ratio and Mw of 8K Daltons, wherein the conversion of the t-butyl ester to carboxylic acid is of higher activation energy than the acid cleavable tertiary ester substituents of the present invention. Relative to the (meth)acrylate based copolymer of the present invention, the ESCAP polymer is significantly more costly to manufacture and exhibits a much higher absorbance. The ESCAP photoresist composition comprised 8 percent by weight solids dissolved in PGMEA. The solids comprised the ESCAP resin, 3 weight percent (relative to polymer) of triphenylsulfonium nonaflate, and 0.075 weight percent (relative to polymer) of TBAH.

Figure 4:
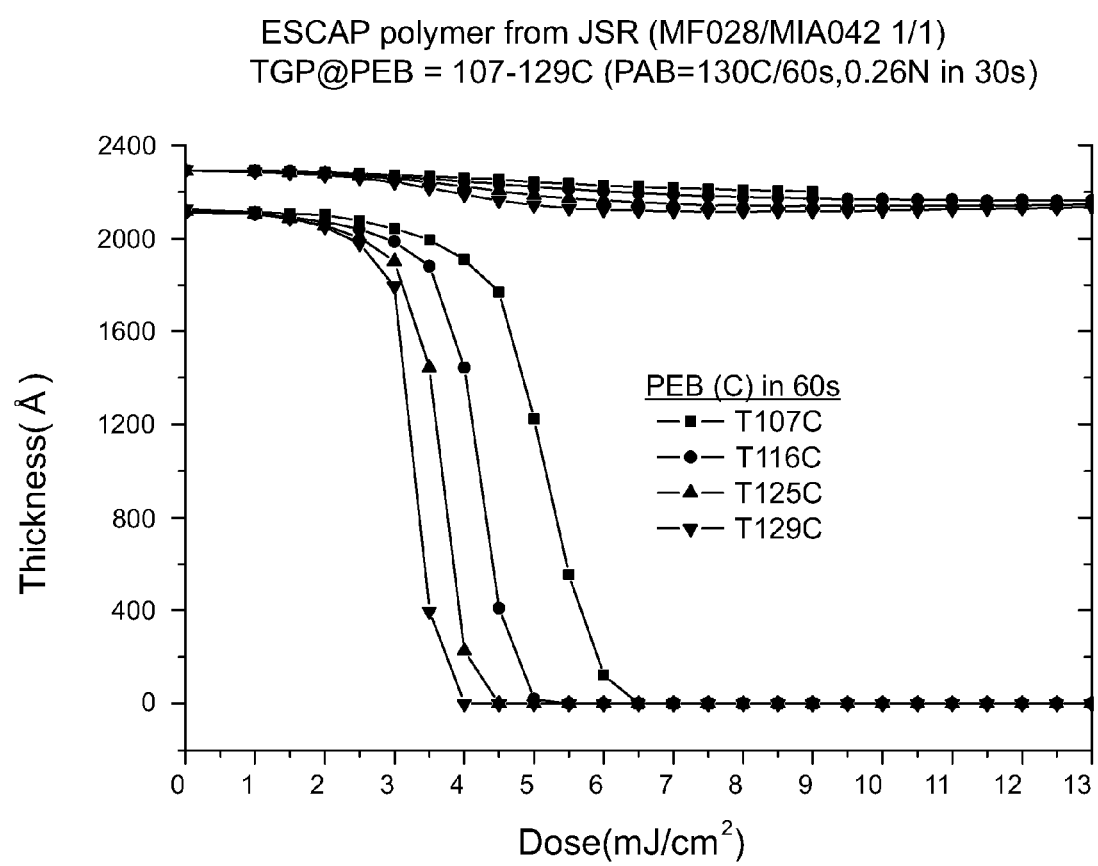
FIG. 4 is a graph of a contrast curve for a comparative ESCAP based photoresist composition.

The comparative ESCAP photoresist composition was spin coated onto the bare silicon wafers, post apply baked at 130° C. for 60 seconds, exposed at 248 nm at 12 mJ/cm$^2$ using an ASML stepper/scanner tool, post exposure baked at 130° C. for 60 seconds and developed in 0.26 N TMAH for 30 seconds. FIG. 4 is a graph of a contrast curve for the photoresist composition. Comparing the contrast curves of FIGS. 1-3 with that of FIG. 4 demonstrates that similar contrast can be obtained with the inventive photoresist composition relative to the significantly higher cost and higher activation energy ESCAP based photoresist composition.

EXAMPLE 7

Figure 5:
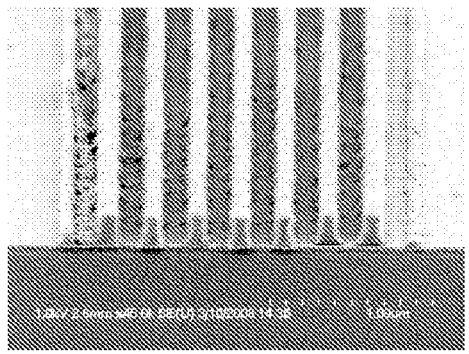
FIG. 5 depicts scanning electron micrographs of 140, 150 and 160 nm lines and spaces obtained from an ECOMA-NLM based photoresist composition of the present invention compared to an ESCAP based photoresist composition.
Figure 5:
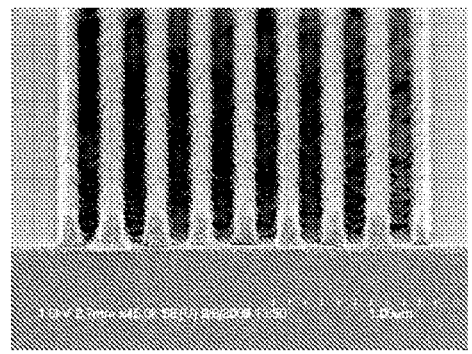
Figure 5:
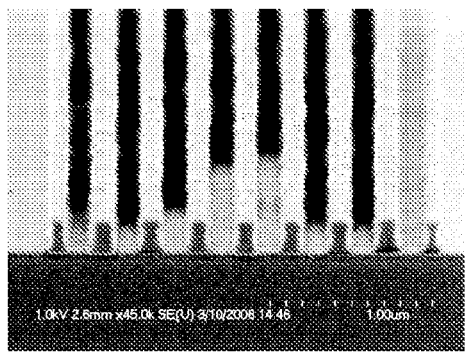
Figure 5:
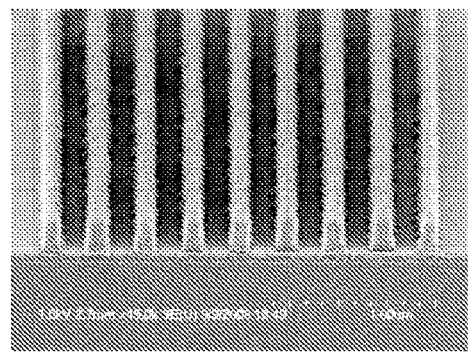
Figure 5:
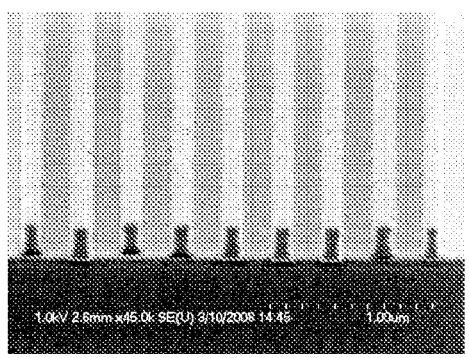
Figure 5:
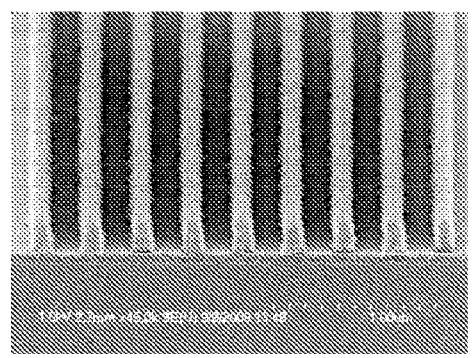

In this example, a photoresist composition of the present invention (Example 4 above) and a prior art ESCAP based photoresist composition (example 6 above) was imagewise exposed to 248 nm radiation using an ASML stepper/scanner and developed to form 140 nm, 150 nm, and 160 nm line-space pairs. The photoresist composition of Example 4 was coated to a thickness of 232 nm and exposed/processed as above. The comparative ESCAP photoresist composition was coated to a thickness of 230 nm, post apply baked at 130° C. for 60 seconds, imagewise exposed at 12.0 mJ/cm$^2$, post exposure baked at 120° C. for 60 seconds and developed in 0.26 N TMAH for 60 seconds. FIG. 5 provides scanning electron micrographs of the images obtained after development. As shown, the photoresist composition of the present invention exhibited high resolution and was comparable in terms of profile to that of the prior art ESCAP photoresist composition.

EXAMPLE 8

Figure 6:
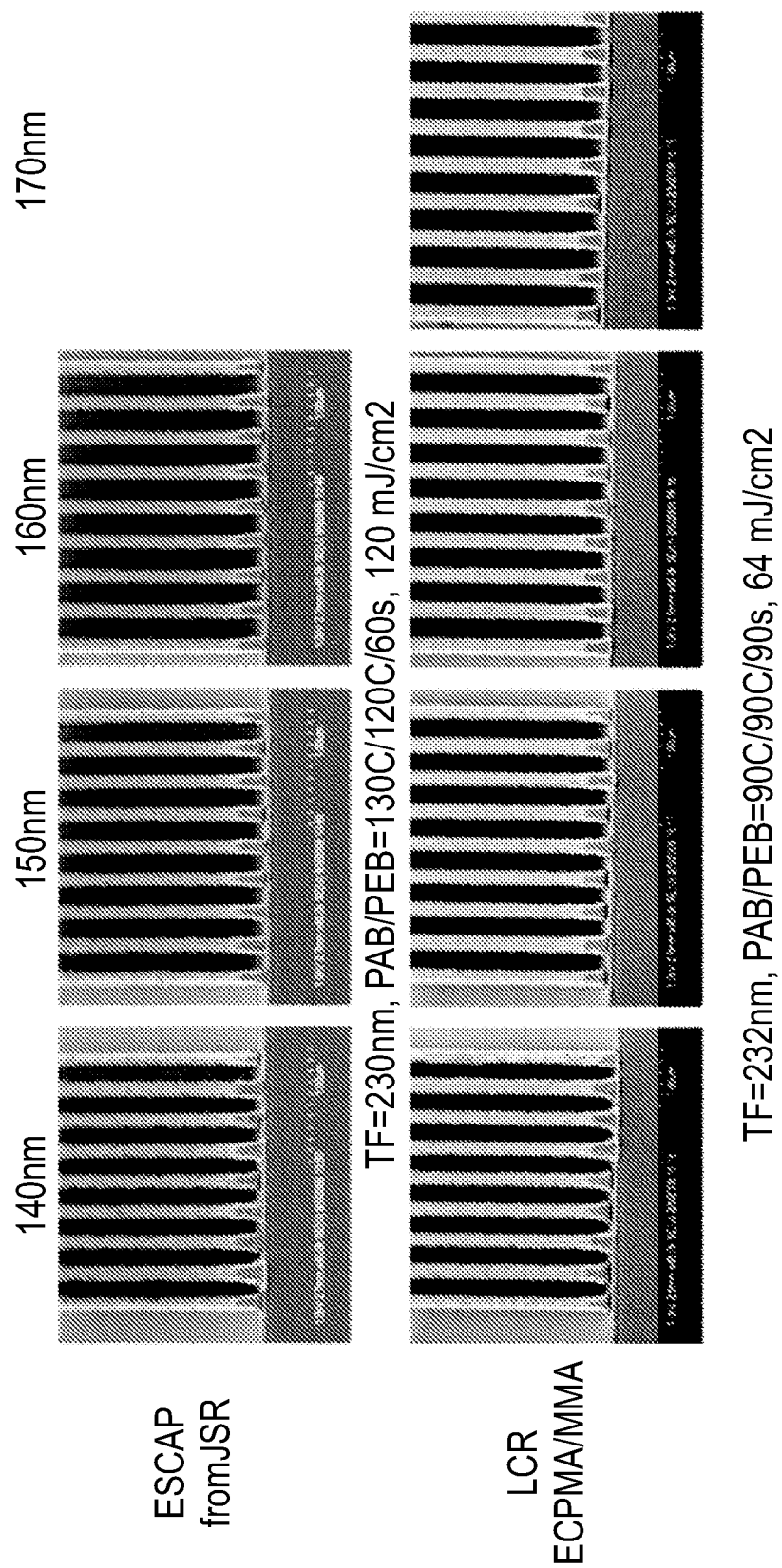
FIG. 6 depicts scanning electron micrographs of 140, 150, 160 and 170 nm lines and spaces obtained from an ECPMA-MMA based photoresist composition of the present invention compared to an ESCAP based photoresist composition.

In this example, a photoresist composition of the present invention (Example 5 above; ECPMA-MMA) and a prior art ESCAP photoresist composition (Example 6 above) were imagewise exposed to 248 nm radiation using an ASML stepper/scanner and developed to form 140 nm, 150 nm, 160 nm, and 170 nm line-space pairs. The ECPMA-MMA based photoresist composition of Example 4 was coated to a thickness of 232 nm, post apply baked at 90° C. for 90 seconds, imagewise exposed at 64 mJ/cm$^2$, post exposure baked at 90° C. for 90 seconds, and developed in 0.26 N TMAH for 60 seconds. The comparative ESCAP photoresist composition was coated to a thickness of 230 nm, post apply baked at 130° C. for 60 seconds, imagewise exposed at 12.0 mJ/cm$^2$, post exposure baked at 120° C. for 60 seconds and developed in 0.26 N TMAH for 60 seconds. FIG. 6 provides scanning electron micrographs of the images obtained after development. As shown, the photoresist composition of the present invention exhibited high resolution and was comparable in terms of profile to that of the prior art ESCAP photoresist composition.

Advantageously, the (meth)acrylate based photoresist compositions of the present invention provides a low cost photoresist for use in DUV lithography. The (meth)acrylate based photoresist compositions utilize commodity materials (e.g., novolac resins) to provide a low cost alternative to current DUV photoresists. The (meth)acrylate based photoresist compositions provide high resolution, can be sensitized for i-line applications, and, because of the high contrast, can be used in thick film applications. Moreover, relative to comparable high activation energy photoresists such as ESCAP based resists, image blur is less of an issue due to the low activation energy acid labile pendant groups.

The foregoing description of the embodiments of this invention has been presented for purposes of illustration and description. It is not intended to be exhaustive or to limit the invention to the precise form disclosed, and many modifications and variations are possible. Such modifications and variations that may be apparent to a person skilled in the art are intended to be included within the scope of this invention as defined by the accompanying claims.

What is claimed is:

1. A photoresist composition comprising:
   a blend of a phenolic polymer with a (meth)acrylate-based copolymer free of an ether-containing moiety and/or a carboxylic acid-containing moiety, the (meth)acrylate-based copolymer consisting of two monomers: i) a first monomer selected from the group consisting of an alkyl acrylate, a substituted alkyl acrylate, an alkyl (meth) acrylate, a substituted alkyl methacrylate and mixtures thereof, and ii) a second monomer selected from the group consisting of an acrylate, a methacrylate and mixtures thereof, the second monomer having an acid cleavable ester substituent, wherein a coating of the blend exhibits no phase incompatibility between the phenolic polymer and the (meth)acrylate-based copolymer; and
   a photoacid generator, wherein the phenolic polymer is greater than 50 parts by weight, the (meth)acrylate-based copolymer is less than 50 parts by weight, and the photoacid generator is 0.1 to 20 parts by weight, wherein the (meth)acrylate-based copolymer comprises less than 25% by weight of the photoresist composition based on total weight of the solids.

2. The photoresist composition of claim 1, wherein the first monomer is from 50 to 90 weight percent and the second monomer is from 10 to 50 weight percent based on a total weight of the (meth)acrylate-based copolymer.

3. The photoresist composition of claim 1, wherein the (meth)acrylate-based copolymer has a molecular weight of 3K to 10K Daltons.

4. The photoresist composition of claim 1, wherein the phenolic polymer has a molecular weight of 3K to 14K Daltons.

5. The photoresist composition of claim 1, wherein the second monomer is selected from the group consisting of 1-methylcyclopentyl (meth)acrylate, 1-ethylcyclopentyl (meth)acrylate, 1-ethylcyclohexyl (meth)acrylate, 1-ethylcycloheptyl (meth)acrylate, 1-ethylcyclooctyl (meth)acrylate, 1-ethylcyclodecyl (meth)acrylate, 1-ethylcyclododecyl (meth)acrylate, 1-ethyl-2-methoxycyclohexyl (meth)acrylate, 1-butylcyclohexyl (meth)acrylate, 1-butyl-2-methoxycyclohexyl (meth)acrylate, 1-cyclopentylcyclopentyl (meth)acrylate, 1-isopropylcycloheptyl (meth)acrylate, 2, 5-dimethyl-1-methylcyclohexyl (meth)acrylate, and mixtures thereof.

6. The photoresist composition of claim 1, wherein the substituted alkyl acrylate and/or the substituted alkyl methacrylate is a hydroxy containing substituent, a sulfonylamido substituent, or a lactone containing substituent.

7. The photoresist composition of claim 1, wherein the phenolic polymer is a novolac polymer.

8. A process for generating a photoresist image on a substrate, comprising:
   coating the substrate with a photoresist film comprising a blend of a phenolic polymer with a (meth)acrylate-based copolymer free of an ether-containing moiety and/or a carboxylic acid-containing moiety, the (meth)acrylate copolymer consisting of two monomers: i) a first monomer selected from the group consisting of an alkyl acrylate, a substituted alkyl acrylate, an alkyl methacrylate, a substituted alkyl methacrylate and mixtures thereof, and ii) a second monomer selected from the group consisting of an acrylate, a methacrylate and mixtures thereof, the second monomer having an acid cleavable ester substituent, and a photoacid generator, wherein the coating of the blend exhibits no phase incompatibility between the phenolic polymer and the (meth)acrylate-based copolymer, and wherein the phenolic polymer is greater than 50 parts by weight, the (meth)acrylate-based copolymer is less than 50 parts by weight, and the photoacid generator is 0.1 to 20 parts by weight, wherein the (meth)acrylate-based copolymer comprises less than 25% by weight of the photoresist composition based on total weight of the solids;
   imagewise exposing the film to radiation;
   heating the film to a temperature less than 110° C.; and
   developing the image to the substrate.

9. The process of claim 8, wherein the photoresist film has a thickness of less than 20 microns.

10. The process of claim 8, wherein the radiation includes a wavelength at 248 nm.

11. The process of claim 8, wherein the photoresist film further comprises a sensitizer, wherein the radiation includes a wavelength at 365 nm.

12. The process of claim 8, wherein the first monomer is from 50 to 90 weight percent and the second monomer is from 10 to 50 weight percent.

13. The process of claim 8, wherein the acid cleavable ester substituent comprises a tertiary alkyl ester.

14. The process of claim 8, wherein the second monomer is selected from the group consisting of 1-methylcyclopentyl (meth)acrylate, 1-ethylcyclopentyl (meth)acrylate, 1-ethylcyclohexyl (meth)acrylate, 1-ethylcycloheptyl (meth)acrylate, 1-ethylcyclooctyl (meth)acrylate, 1-ethylcyclodecyl (meth)acrylate, 1-ethylcyclododecyl (meth)acrylate, 1-ethyl-2-methoxycyclohexyl (meth)acrylate, 1-butylcyclohexyl (meth)acrylate, 1-butyl-2-methoxycyclohexyl (meth)acrylate, 1-cyclopentylcyclopentyl (meth)acrylate, 1-isopropylcycloheptyl (meth)acrylate, 2, 5-dimethyl-1-methylcyclohexyl (meth)acrylate, and mixtures thereof.

15. The process of claim 8, wherein the substituted alkyl acrylate and/or the substituted alkyl methacrylate is a hydroxy containing substituent, a sulfonylamido substituent, or a lactone containing substituent.

16. The process of claim 8, wherein the phenolic polymer is a novolac polymer.

* * * * *